(12) United States Patent
Sakata et al.

(10) Patent No.: US 10,256,120 B2
(45) Date of Patent: Apr. 9, 2019

(54) SYSTEMS, METHODS AND APPARATUS FOR POST-CHEMICAL MECHANICAL PLANARIZATION SUBSTRATE BUFF PRE-CLEANING

(71) Applicant: Applied Materials, Inc., Santa Clara, CA (US)

(72) Inventors: Clinton P. Sakata, San Jose, CA (US); Hui Chen, Burlingame, CA (US); Jim K. Atkinson, Los Gatos, CA (US); Brian J. Brown, Palo Alto, CA (US); Jianshe Tang, San Jose, CA (US); Yufei Chen, Cupertino, CA (US); Yunshuang Ding, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 355 days.

(21) Appl. No.: 14/523,827

(22) Filed: Oct. 24, 2014

(65) Prior Publication Data

US 2015/0114430 A1    Apr. 30, 2015

Related U.S. Application Data

(60) Provisional application No. 61/895,527, filed on Oct. 25, 2013, provisional application No. 61/909,973, filed on Nov. 27, 2013.

(51) Int. Cl.
*H01L 21/00* (2006.01)
*H01L 21/67* (2006.01)
(Continued)

(52) U.S. Cl.
CPC ........ *H01L 21/67046* (2013.01); *B08B 1/006* (2013.01); *B08B 1/04* (2013.01)

(58) Field of Classification Search
None
See application file for complete search history.

(56) References Cited

U.S. PATENT DOCUMENTS

| 3,658,143 A | 4/1972 | Schwartz et al. |
| 5,230,184 A * | 7/1993 | Bukhman ............... B24B 37/11 |
| | | 451/41 |

(Continued)

FOREIGN PATENT DOCUMENTS

| CN | 1795074 | 6/2006 |
| CN | 1965395 A | 5/2007 |

(Continued)

OTHER PUBLICATIONS

Non-Final Office Action of U.S. Appl. No. 14/167,818 dated Oct. 28, 2016.

(Continued)

*Primary Examiner* — Mikhail Kornakov
*Assistant Examiner* — Ryan L. Coleman
(74) *Attorney, Agent, or Firm* — Dugan & Dugan, PC

(57) ABSTRACT

In some embodiments, an apparatus for cleaning a substrate is provided that includes (1) a substrate chuck configured to support a substrate with a front side of the substrate accessible; (2) a buff pad assembly configured to support a buff pad having a diameter smaller than a diameter of the substrate; and (3) a swing arm coupled to the buff pad and configured to position and rotate the buff pad along the front side of the substrate, and control an amount of force applied by the buff pad against the front side of the substrate during cleaning. The substrate chuck, buff pad assembly and swing arm are configured to buff clean the substrate. Numerous additional aspects are disclosed.

13 Claims, 11 Drawing Sheets

(51) Int. Cl.
  *B08B 1/00* (2006.01)
  *B08B 1/04* (2006.01)

(56) References Cited

U.S. PATENT DOCUMENTS

| | | | |
|---|---|---|---|
| 5,282,289 | A | 2/1994 | Hasegawa |
| 5,357,645 | A | 10/1994 | Onodera |
| 5,647,083 | A | 7/1997 | Sugimoto |
| 5,804,507 | A | 9/1998 | Perlov et al. |
| 5,860,181 | A | 1/1999 | Maekawa et al. |
| 5,928,062 | A | 7/1999 | Miller |
| 5,996,594 | A | 12/1999 | Roy et al. |
| 6,106,369 | A | 8/2000 | Konishi |
| 6,123,607 | A * | 9/2000 | Ravkin .............. B24B 21/18 451/43 |
| 6,126,517 | A | 10/2000 | Tolles et al. |
| 6,156,124 | A | 12/2000 | Tobin |
| 6,244,931 | B1 | 6/2001 | Pinson et al. |
| 6,287,172 | B1 | 9/2001 | Kuan et al. |
| 6,543,079 | B1 | 4/2003 | Yeo |
| 6,602,121 | B1 | 8/2003 | Halley |
| 2002/0092544 | A1 | 7/2002 | Namba |
| 2002/0132566 | A1 | 9/2002 | Jeong |
| 2003/0162486 | A1 | 8/2003 | Stoeckgen et al. |
| 2005/0103106 | A1 | 5/2005 | Campbell |
| 2005/0121969 | A1* | 6/2005 | Emesh .............. B24B 7/228 301/37.105 |
| 2006/0035563 | A1* | 2/2006 | Kalenian ............ B24B 37/30 451/5 |
| 2006/0035564 | A1 | 2/2006 | Novak et al. |
| 2006/0073768 | A1 | 4/2006 | Mavliev et al. |
| 2007/0087672 | A1* | 4/2007 | Benner .............. B24B 53/017 451/56 |
| 2010/0130105 | A1 | 5/2010 | Lee |
| 2011/0265816 | A1 | 11/2011 | Chen |
| 2013/0111678 | A1 | 5/2013 | Chen et al. |
| 2013/0196572 | A1 | 8/2013 | Ko |
| 2014/0209239 | A1 | 7/2014 | Ko et al. |
| 2016/0192738 | A1 | 7/2016 | Rosa |

FOREIGN PATENT DOCUMENTS

| | | |
|---|---|---|
| JP | 10-340873 A | 12/1998 |
| TW | 200735200 | 9/2007 |
| TW | 200809936 | 2/2008 |

OTHER PUBLICATIONS

International Search Report and Written Opinion of International Application No. PCT/US14/13607 dated May 20, 2014.
Zuniga et al., U.S. Appl. No. 14/260,210, titled: "Systems, Methods and Apparatus for Post-Chemical Mechanical Planarization Substrate Cleaning," filed Apr. 23, 2014.
International Preliminary Report on Patentability of International Application No. PCT/US2014/062264 dated May 6, 2016.
Restriction Requirement of U.S. Appl. No. 14/167,818 dated Jul. 14, 2016.
International Preliminary Report on Patentability of International Application No. PCT/US2014/013607 dated Aug. 13, 2015.
Sep. 14, 2016 Reply to Jul. 14, 2016 Restriction Requirement of U.S. Appl. No. 14/167,818.
International Search Report and Written Opinion of International Application No. PCT/US2014/062264 dated Feb. 25, 2015.
Chinese Search Report of Chinese Application No. 201480006171.3 dated Feb. 4, 2017.
Jan. 30, 2017 Reply to Oct. 28, 2016 Non-Final Office Action of U.S. Appl. No. 14/167,818.
Notice of Allowance of U.S. Appl. No. 14/167,818 dated Mar. 10, 2017.
Chinese Search Report of Chinese Application No. 201480057214.0 dated Jun. 16, 2017.
Taiwan Search Report of Taiwan Application No. 103136825 dated Dec. 11, 2017.
Chinese Search Report of Chinese Application No. 201480057214.0 dated Nov. 30, 2017.
Taiwan Search Report of Taiwan Application No. 103103628 dated Sep. 28, 2017.
Taiwan Search Report of Taiwan Application No. 103136825 dated Aug. 8, 2018.
Chinese Search Report of Chinese Application No. 201480057214.0 dated Jul. 15, 2018.

* cited by examiner

SYSTEMS, METHODS AND APPARATUS FOR POST-CHEMICAL MECHANICAL PLANARIZATION SUBSTRATE BUFF PRE-CLEANING

The present application claims priority to U.S. Provisional Patent Application No. 61/895,527, filed Oct. 25, 2013 and U.S. Provisional Patent Application No. 61/909,973, filed Nov. 27, 2013, each of which is hereby incorporated by reference herein in its entirety for all purposes.

FIELD

Embodiments of the invention relate generally to electronic device manufacturing including chemical mechanical planarization (CMP), and more particularly to methods and apparatus for substrate buff pre-cleaning after CMP.

BACKGROUND

After a chemical mechanical planarization (CMP) process is performed on a substrate, the substrate typically is cleaned to remove unwanted debris and particles from the substrate. For example, slurry, polished substrate material or other residue may cling to the substrate, including the edge bevel of the substrate.

Following CMP, substrates may be rinsed and transferred to a cleaning module such as a scrubber brush box, a megasonic tank, etc., to remove such unwanted material. However, some particles and residue that remain following CMP may be difficult to remove using conventional cleaning methods of brush box scrubbing, megasonic tank immersion or the like.

SUMMARY

In some embodiments, an apparatus for cleaning a substrate is provided that includes (1) a substrate chuck configured to support a substrate with a front side of the substrate accessible; (2) a buff pad assembly configured to support a buff pad having a diameter smaller than a diameter of the substrate; and (3) a swing arm coupled to the buff pad and configured to position and rotate the buff pad along the front side of the substrate, and control an amount of force applied by the buff pad against the front side of the substrate during cleaning. The substrate chuck, buff pad assembly and swing arm are configured to buff clean the substrate.

In some embodiments, a pre-clean buff module for cleaning a substrate following chemical mechanical planarization is provided that includes (1) a tank; (2) a substrate chuck positioned within the tank and configured to support a substrate with a front side of the substrate accessible; (3) a buff pad assembly positioned within the tank and configured to support a buff pad having a diameter smaller than a diameter of the substrate; and (4) a swing arm positioned within the tank and coupled to the buff pad assembly and configured to position and rotate the buff pad along the front side of the substrate and control an amount of force applied by the buff pad against the front side of the substrate; and (5) a pad conditioning station positioned within the tank and configured to at least one of clean and condition the buff pad, the pad conditioning station positioned so that the swing arm is rotatable to place the buff pad proximate the pad conditioning station. The substrate chuck, buff pad assembly and swing arm are configured to buff clean the substrate after a chemical mechanical planarization process.

In some embodiments, a method of cleaning a substrate in a substrate buff module is provided that includes (1) loading a substrate into the buff module; (2) securing the substrate to a substrate chuck; (3) rotating the substrate using the substrate chuck; (4) moving a swing arm having a rotatable buff pad over the substrate; (5) rotating the buff pad; (6) pressing the buff pad against a front side of the substrate; and (7) sweeping the rotating buff pad across the front side of the substrate using the swing arm so as to clean the substrate.

Other features and aspects of embodiments of the invention will become more fully apparent from the following detailed description of example embodiments, the appended claims, and the accompanying drawings.

BRIEF DESCRIPTION OF THE DRAWINGS

Various embodiments of the invention are disclosed in the following detailed description and accompanying drawings.

DETAILED DESCRIPTION

Figure 1A:
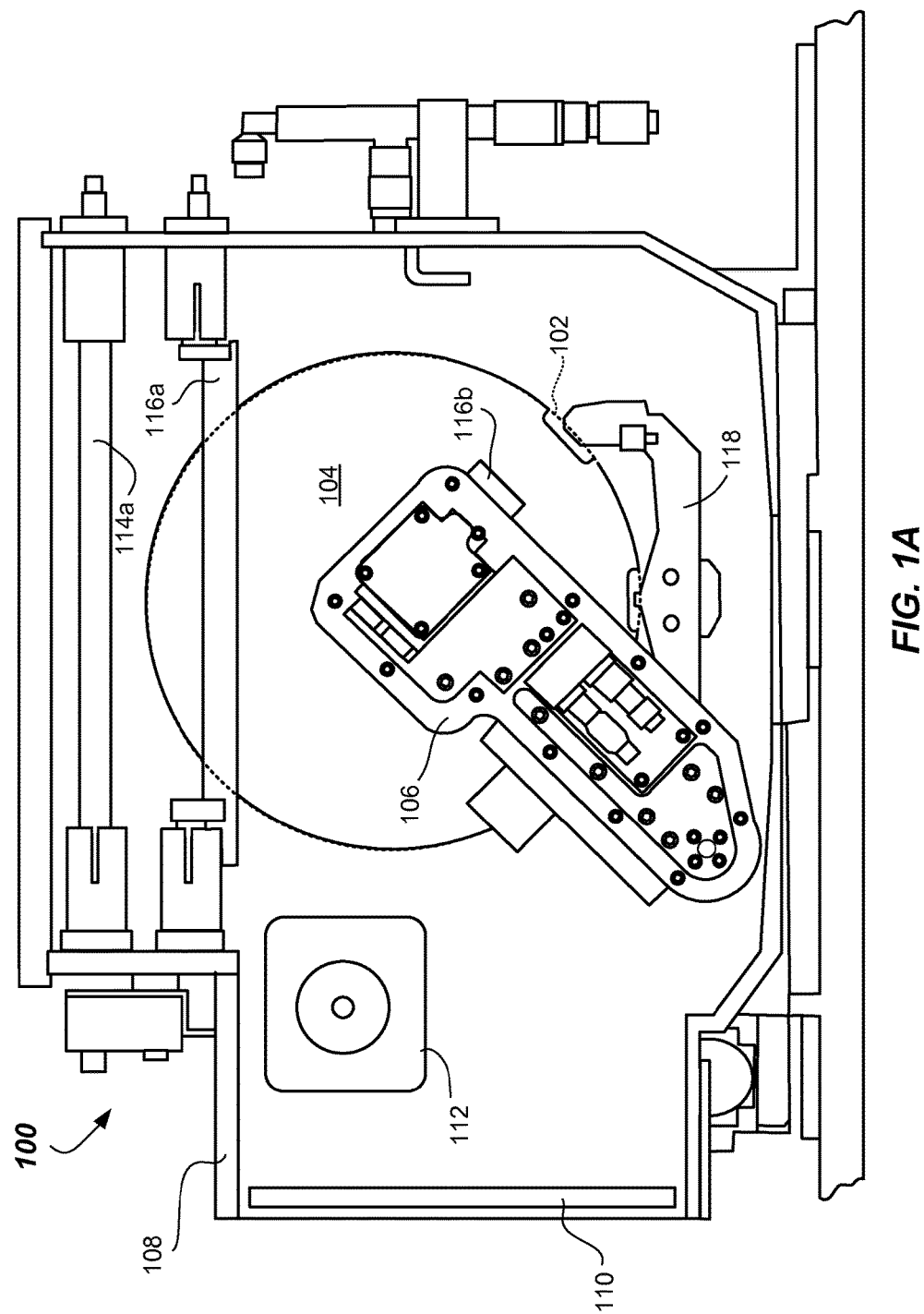
FIG. 1A is a front view of an example pre-clean buff system or "module" for pre-clean buffing a substrate provided in accordance with one or more embodiments of the present invention.

In one or more embodiments of the present invention, a pre-clean buff module is provided for removing slurry, polished substrate material or other residue that may be difficult to remove using conventional brush scrubbing, megasonic cleaning or the like. The pre-clean buff module may allow for targeted buff cleaning of any area of the substrate, such as substrate edges or bevels, that may be difficult to cleaning within a brush box scrubber or megasonic tank.

In some embodiments, the pre-clean buff module includes a substrate chuck for holding a substrate during pre-clean buffing, and a buff pad coupled to a swing arm that allows the buff pad to swing across a front surface of the substrate during pre-clean buffing. One or both of the substrate chuck and buff pad may rotate during buff cleaning. A rinsing fluid delivery mechanism and/or chemical delivery mechanism are provided for rinsing and/or delivering cleaning chemicals to the substrate (e.g., before, during or after pre-clean buffing). In some embodiments, the chemical delivery mechanism may be coupled to and travel with the swing arm during pre-clean buffing.

As used herein unless otherwise specified, the term "polish" is intended to mean the removal of material from a substrate that results in planarizing and thinning of the substrate. Polishing may be performed during a CMP process using a polish pad to planarize and thin a substrate down to an endpoint (e.g., a particular surface smoothness or layer thickness).

As used herein unless otherwise specified, the term "buff" is intended to mean the removal of residue or other particles that have inadvertently become adhered to a substrate. Buffing may be performed during a post-CMP, pre-cleaning buff process using a buff pad. The pre-clean buff process may be performed until a lower or otherwise predetermined threshold of surface particles has been reached. Compared to polishing, pre-clean buffing is a less aggressive process using a softer buff pad not intended to thin the substrate, but rather to merely remove debris or other residue that has adhered to or otherwise become attached to the substrate.

As used herein unless otherwise specified, the term "scrub" is intended to mean the removal of residue and particles that have accumulated on a substrate but do not require substantial force to remove. Scrubbing may be performed during a cleaning process after a pre-clean buff process. Example cleaning processes including brush scrubbing or megasonic cleaning. Compared to pre-clean buffing, scrubbing is a less aggressive process using a soft brush (e.g., in a scrubber brush box) and/or megasonic energy not intended to apply significant pressure to the substrate.

Following CMP, substrates are typically rinsed and transferred directly to a cleaning module such as a scrubber brush box, a megasonic tank, or the like. However, some adhered particles and residues that remain following CMP may be difficult to remove within a conventional brush box or megasonic tank. Thus, embodiments of the present invention provide pre-clean buffing systems, apparatus and processes that "pre-clean" substrates after CMP, but prior to (and/or in place of) conventional scrubbing substrate cleaning.

Compared to conventional cleaning processes, the pre-clean buff process may employ a harder buff pad and/or a chemically assisted cleaning process to clean difficult to remove particles and/or residues from a substrate prior to conventional substrate cleaning. For example, the pre-clean buff process can employ direct front side buffing of a substrate surface with a polyurethane, silicone, polyvinyl alcohol or similar buff pad or brush with a suitable cleaning chemistry (e.g., an acid solution, a base solution, an $H_2O_2$ solution, etc.).

More generally, embodiments of the present invention provide a compact arrangement to pre-clean substrates after CMP by using a chuck (e.g., a vacuum chuck) to support a substrate so the front side is accessible for direct buffing using a relatively small buff pad applied to a specific area of the front side of the substrate. In some embodiments, the buff pad may include a stacked buff pad and sub-pad having a contact area with a diameter smaller than the diameter of the substrate, for example, a buff pad with a diameter that is less than half the diameter of the substrate.

Because a small buff pad is used, direct front side metrology can be used concurrently during cleaning without having to image through a window, buff pad or the like. Chemistry may be dispensed directly on the front side of the substrate, easing dispensing distribution as well as chemical consumption. In some embodiments, chemistry may be delivered directly to the substrate by an embedded spray dispenser mounted on a swing arm supporting the buff pad. This can reduce chemistry consumption by improving and/or optimizing control of the dispensing. In one or more embodiments, cleaning chemistry may be delivered directly through the buff pad.

Embodiments described herein enable cleaning of a substrate by applying different loads on and/or rotation rates to the buff pad. A pre-clean buff profile is controllable by the buff pad position and/or buff pad sweeping profile (e.g., including sweep range, frequency, shape, time for each sweeping zone, etc.), and/or substrate rotation rate, buff pad speed, and/or buff pad pressure with sweep position, for example. Various embodiments can target specific regions of the substrate, so that the pre-clean buff system can be used to improve the edge defectivity of a substrate (e.g., reduce defect levels near the edge of the substrate), which is difficult to achieve using conventional cleaning methods. In addition, embodiments of the present invention can provide a pre-clean buff function similar to processes developed using conventional CMP methods for the purpose of replacing, or re-configuring, an additional platen in a CMP system.

FIG. 1A is a front view of an example pre-clean buff system or "module" 100 for pre-clean buffing a substrate 102 (shown in phantom) provided in accordance with one or more embodiments of the present invention. The pre-clean buff module 100 includes a substrate chuck 104 that may hold the substrate 102 during pre-clean buffing within the pre-clean buff module 100. A swing arm 106 with a buff pad (described below) pivots or otherwise swings relative to the substrate chuck 104 during pre-clean buffing as further described below. In the embodiment shown, the substrate 102 is buffed while in a vertical orientation. Other substrate orientations may be used (e.g., horizontal).

The substrate chuck 104 and swing arm 106 are positioned within a tank or body 108 of the pre-clean buff module 100. A service hatch 110 of the tank 108 allows service access to the swing arm 106 (e.g., as the swing arm may be rotated through and/or accessed via the service hatch 110).

The pre-clean buff module 100 also includes a pad conditioning station 112 that allows the buff pad held by the swing arm 106 to be conditioned and/or cleaned. In some embodiments, such conditioning and/or cleaning may be performed while a substrate is transferred into and/or from the pre-clean buff module 100. This may increase system throughput by eliminating a separate buff pad conditioning and/or cleaning step.

The pre-clean buff module 100 may include one or more rinsing fluid delivery mechanisms 114a-b (only 114a shown in FIG. 1A; see also FIG. 2) for delivering a rinsing fluid such as deionized (DI) water to a front and/or back side of the substrate 102 as the substrate 102 is loaded into, removed from, and/or buffed within the pre-clean buff module 100. In some embodiments, the rinsing fluid delivery mechanisms 114a-b may be spray bars, as shown, although any rinsing fluid delivery mechanisms may be employed (e.g., nozzles).

A chemical delivery mechanism 116a may be provided for delivering chemicals to the substrate 102, such as during pre-clean buffing. For example, the chemical delivery mechanism 116a may deliver a chemical such as an acid solution, a base solution, an $H_2O_2$ solution, etc., to a front side of the substrate 102 while the substrate 102 is buffed within the pre-clean buff module 100, or at any suitable time. In some embodiments, the chemical delivery mechanisms 116a may be a spray bar, as shown, although any chemical delivery mechanisms may be employed (e.g., nozzles).

In some embodiments, a chemical delivery mechanism 116b may be coupled to the swing arm 106 for delivering chemicals to the substrate 102 during pre-clean buffing, in place of or in addition to chemical delivery mechanism 116a. Use the chemical delivery mechanism 116b allows for precise placement of chemicals at the brush pad/substrate interface. For example, the swing arm 106 may obstruct delivery of chemicals from the chemical delivery mechanism 116a in some positions. However, the chemical delivery mechanism 116b travels with the swing arm 106 and may more consistently and/or controllably deliver chemicals to the brush pad/substrate interface. In yet other embodiments, chemical delivery may occur through the buff pad held by the swing arm 106. Different rinsing and/or cleaning fluids may be used to clean and/or rinse the substrate 102 and the buff pad 208.

Figure 1B:
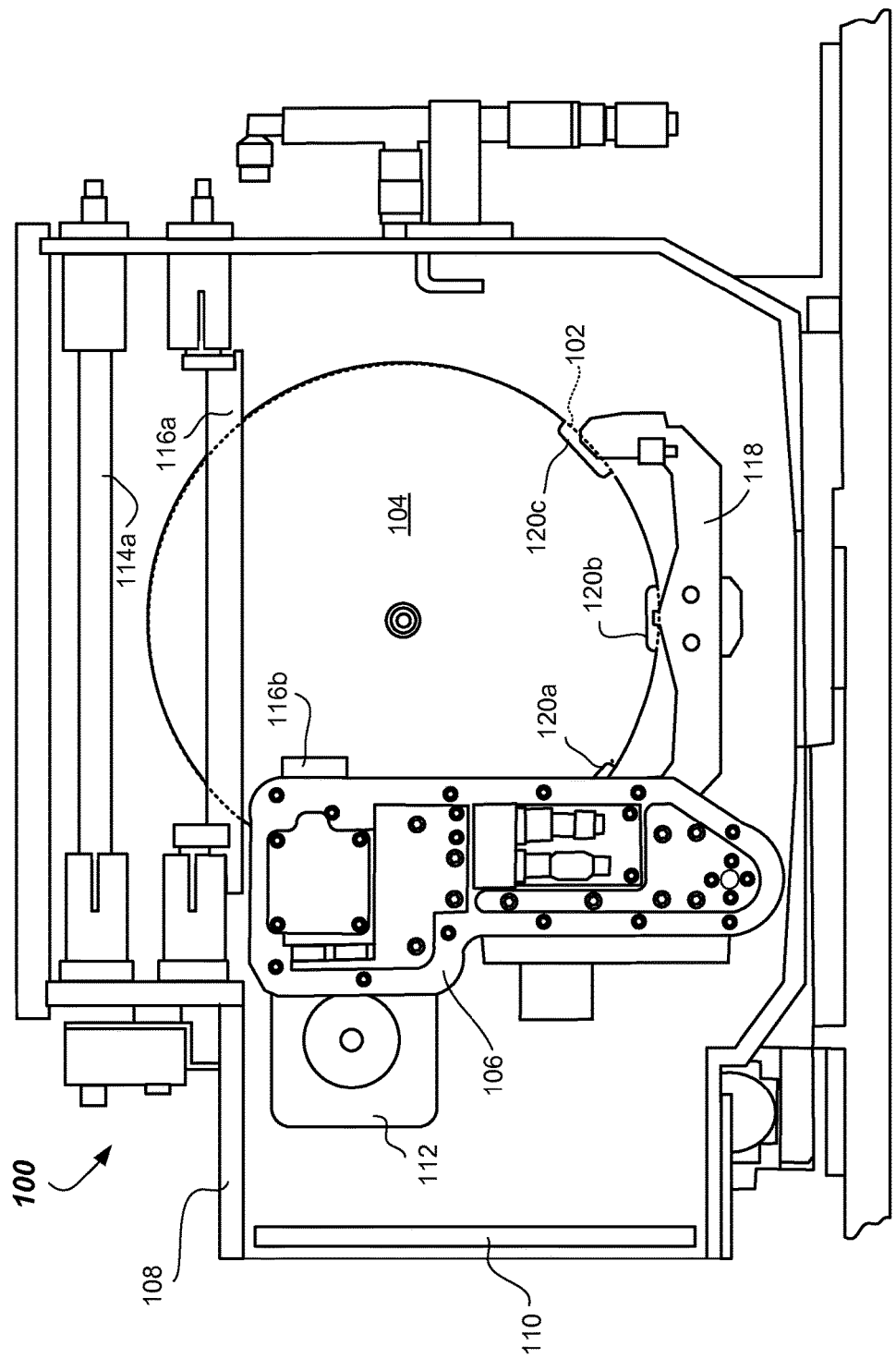
FIGS. 1B and 1C are front views of the pre-clean buffing module of FIG. 1A as the swing arm swings away from a substrate during a transfer operation and/or for service via a service hatch provided in accordance with embodiments of the present invention.
Figure 1C:
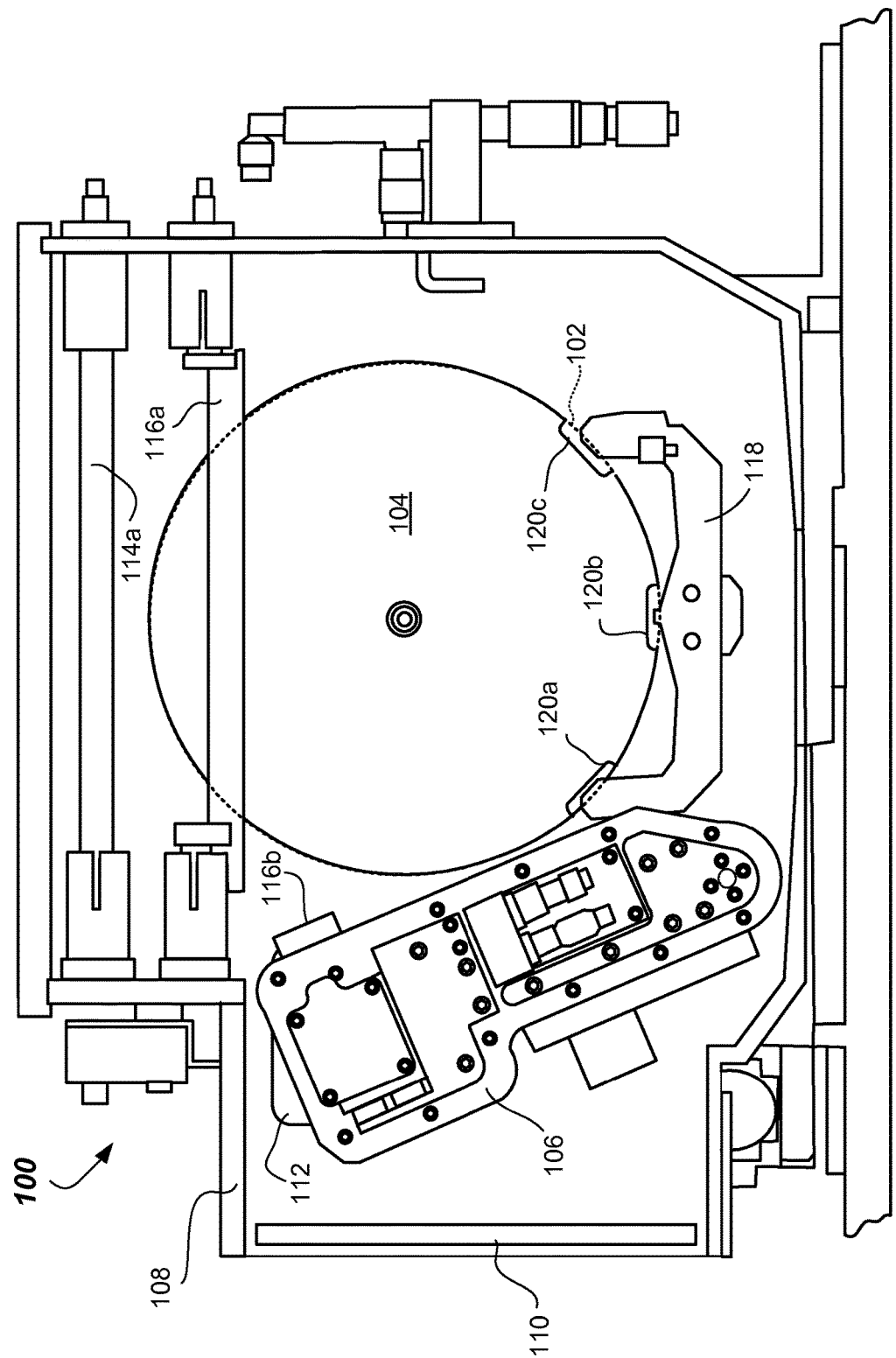

FIGS. 1B and 1C are alternative front views of the pre-clean buffing module 100 as the swing arm 106 swings away from the substrate 102 during an unload operation and/or for service via the service hatch 110. For example, in FIG. 1C, the swing arm 106 is positioned in front of the pad conditioning station 112 so that the buff pad may be conditioned and/or cleaned as described further below.

With reference again to FIGS. 1A-C, and in particular FIG. 1C, the substrate 102 may be loaded into the pre-clean buff module 100 via a robot (not shown), such as a walking or running beam robot, which lowers the substrate 102 into the pre-clean buff module 100 in between the rinsing fluid mechanisms 114a-b (FIG. 2), past the chemical deliver mechanism 116a (if employed) and onto a substrate support 118 positioned in front of the substrate chuck 104. The substrate support 118 may move the substrate 102 toward (during loading) or away from (during unloading) the substrate chuck 104 as described further below. In some embodiments, the substrate support 118 contacts the substrate 102 in at least 3 locations to provide stable support for the substrate 102. Notches 120a-c may be provided in the substrate chuck 104 to allow the substrate support 118 to move the substrate 102 into contact with the substrate chuck 104 during a loading operation, or remove the substrate 102 from contact with the substrate chuck 104 during an unload operation. Other numbers and/or locations of substrate contact points and/or substrate chuck notches may be employed.

Figure 2:
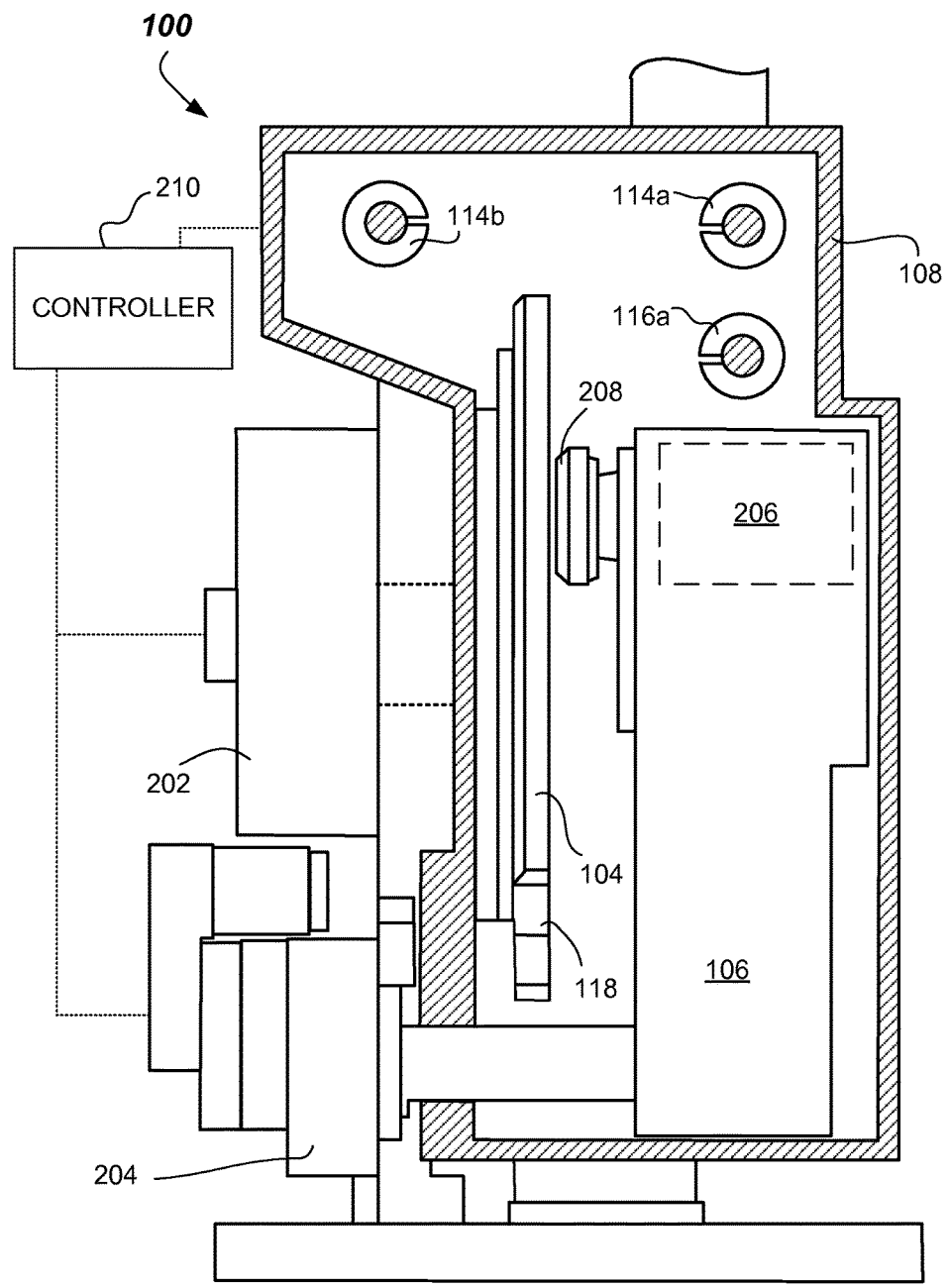
FIG. 2 is a partial-cross, side-sectional view of the pre-clean buff module of FIG. 1A provided in accordance with one or more embodiments of the invention.

FIG. 2 is a partial-cross sectional side view of the pre-clean buff module 100 provided in accordance with one or more embodiments of the invention. With reference to FIG. 2, in some embodiments, a first motor 202 is coupled to and controls rotation of the substrate chuck 104 during pre-clean buffing with the pre-clean buff module 100. A second motor 204 may be provided for controlling position, swing and/or reciprocating motion (if employed) of the swing arm 106 during pre-clean buffing with the pre-clean buff module 100. A third motor 206 may be provided for controlling rotation of a buff pad 208 coupled to the swing arm 106 during pre-clean buffing and/or conditioning/cleaning of the buff pad 208 (using the pad conditioning station 112) with the pre-clean buff module 100. In some embodiments, each motor 202-206 may be controlled individually. An additional motor (not shown) may be employed to control movement of the substrate support 118 (FIGS. 1A-1C). A controller 210 may be provided for controlling rotation of the motors 202-206, swing profile and/or buffing profile, delivery of rinsing fluid and/or chemicals to the substrate 102, loading and/or unloading of the substrate 102 via the substrate support 118, or the like. In general, the controller 210 may be operable to activate, monitor, and/or control the various assemblies of the system 100.

In some embodiments, the controller 210 may include a processor and a memory operative to store instructions (e.g., a software program) executable by the processor. The processor can include an input/output (I/O) interface adapted to send control signaling to the various assemblies of the system (e.g., the substrate chuck 104, the swing arm 106, the motors 202-206, the rinsing fluid and/or chemical delivery mechanisms 114a-b and 116a-b, the substrate support 118, etc.) as well as status signaling to external systems monitoring and controlling the system 100. Likewise, the I/O interface can be further adapted to receive control signaling from external systems and status signaling from sensors (e.g., pressure feedback transducers, rotation speed sensors, metrology sensors, etc.) or other components of the various assemblies of the system 100. Communication between the I/O interface, the external systems, and the various assemblies of the system 100 can be via wiring or via wireless signaling. The controller 210 may be programmed to perform, and/or include computer program code for performing, any of the pre-buff methods and/or operations described herein.

Figure 3:
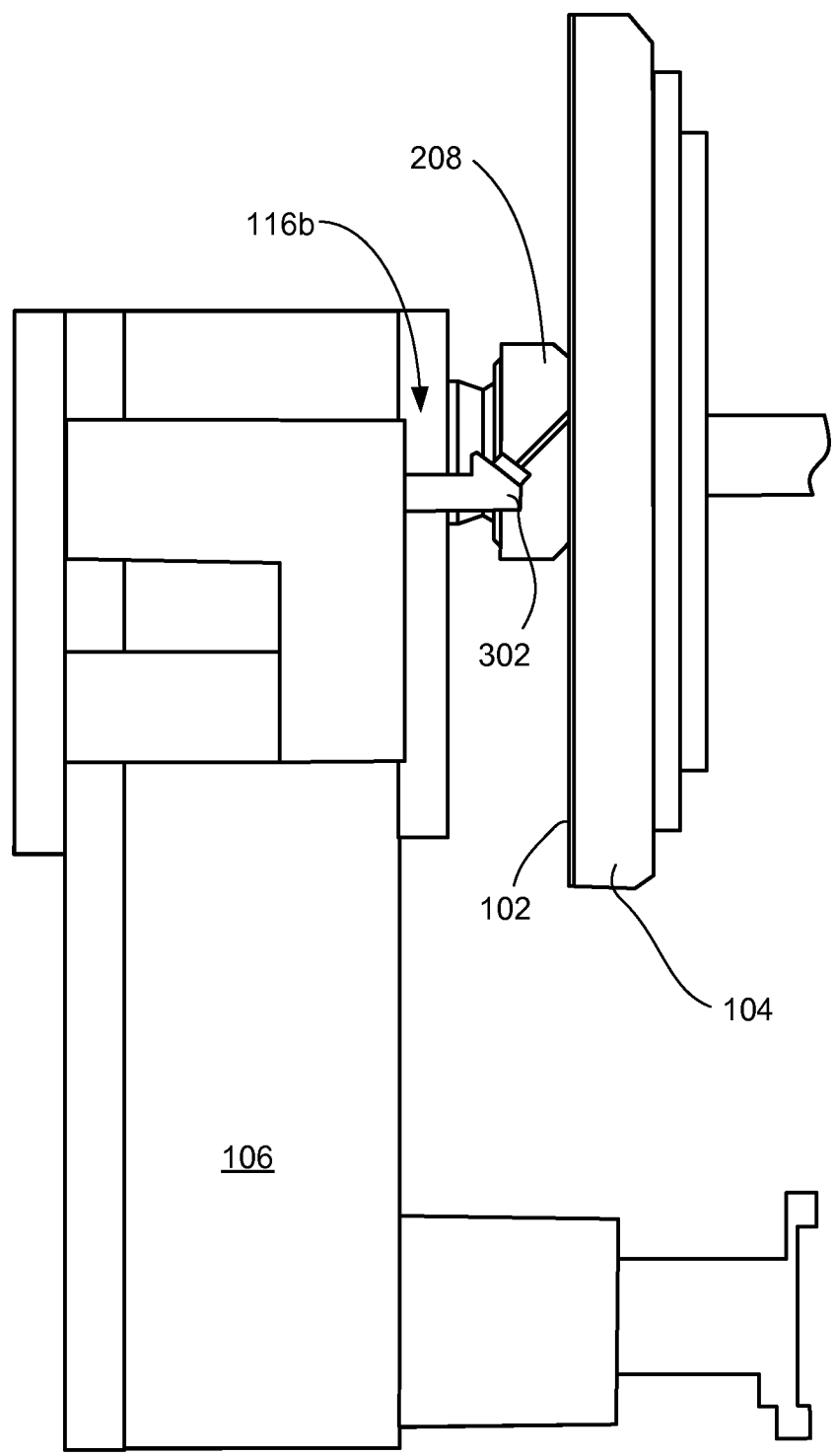
FIG. 3 is a side view of the swing arm of FIGS. 1A-C illustrating an example embodiment of a chemical delivery mechanism coupled to the swing arm provided in accordance with embodiments of the present invention.

FIG. 3 is a side view of the swing arm 106 illustrating an example embodiment of the chemical delivery mechanism 116b coupled to the swing arm 106. The chemical delivery mechanism 116b includes a nozzle 302 coupled to the swing arm 106 that directs a fluid, such as a chemical fluid, to an interface between the buff pad 208 and substrate 102 while the substrate 102 is held by the substrate chuck 104. Other chemical delivery mechanisms, positions and/or configurations may be employed.

Figure 4A:
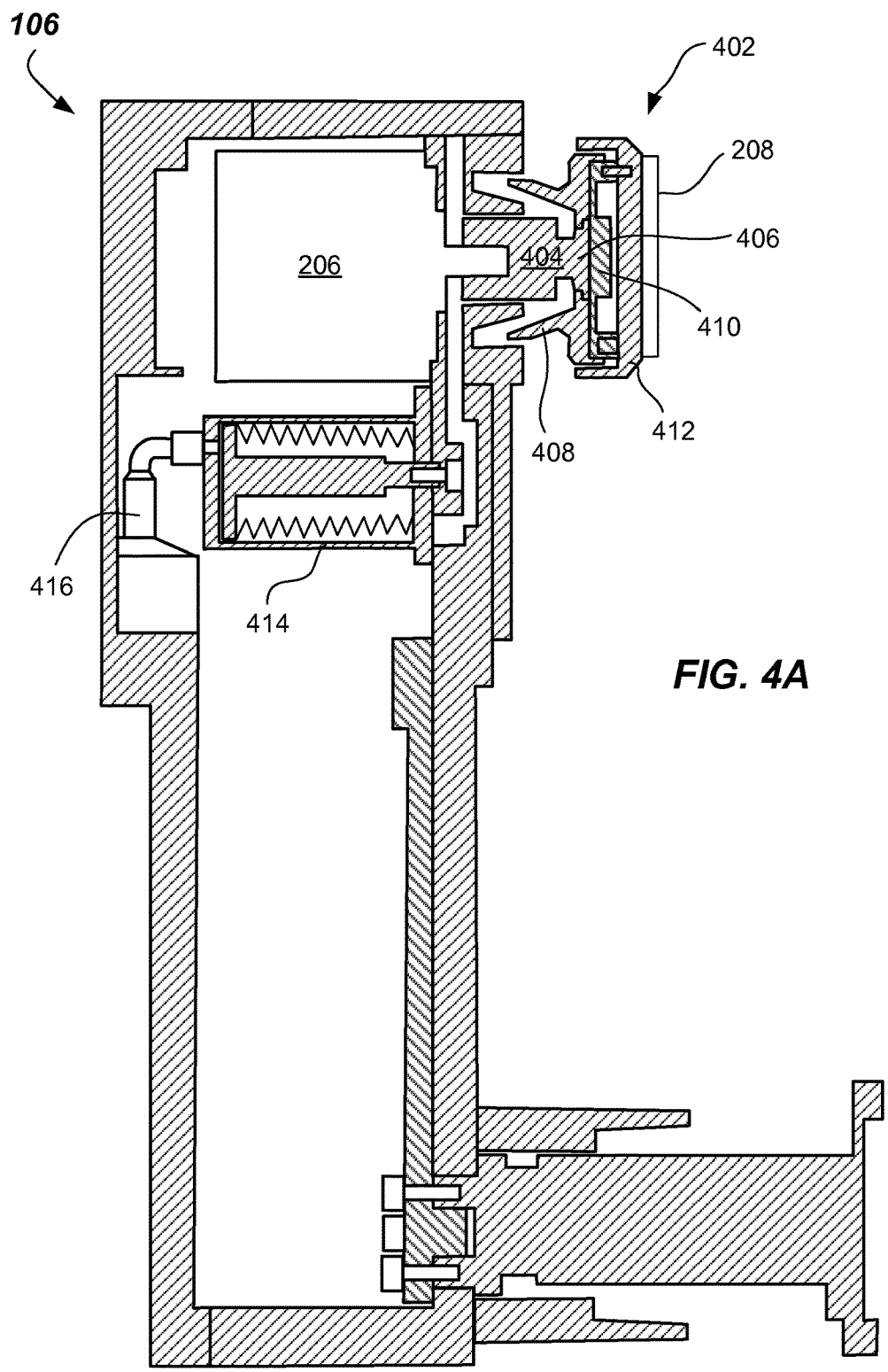
FIG. 4A is as partial cross-sectional view of the swing arm of FIGS. 1A-C coupled to a buff pad assembly provided in accordance with one or more embodiments of the invention.

FIG. 4A is as partial cross-sectional view of the swing arm 106 coupled to a buff pad assembly 402 provided in accordance with one or more embodiments of the invention. In the embodiment of FIG. 4A, the swing arm 106 includes the motor 206 coupled to the buff pad assembly 402 for rotating the buff pad 208 during buffing within the pre-clean buff module 100. For example, the motor 206 may be coupled to a shaft coupling 404 having a rounded portion 406. A gimbal shroud 408 may couple to the rounded portion 406 of the shaft coupling 404 to form a gimbal between the motor 206 and the buffing pad assembly 402. In some embodiments, the buff pad assembly 402 includes a flexure plate 410 coupled to a buff head cap 412 (described further below with reference to FIGS. 5A and 5B).

As shown in FIG. 4A, the swing arm 106 may include an inflatable (and deflatable) bellows 414 coupled to the motor 206 and buff pad assembly 402. For example, nitrogen or another suitable gas may be flowed into the bellows 414 through gas line 416. This gas causes bellows 414 to expand, which in turn pushes motor 206 and buff pad assembly 402 away from swing arm 106 and toward substrate 102 held by substrate chuck 104. Increasing or decreasing the pressure of gas delivered to bellows 414 increases or decreases the force by which buff pad 208 is pressed against substrate 102. The gimbal between the motor 206 and buff pad assembly 402 allows freedom of movement of the buff pad assembly 402 so that the buff pad 208 remains in contact with the substrate 102 during pre-clean buffing.

Figure 4B:
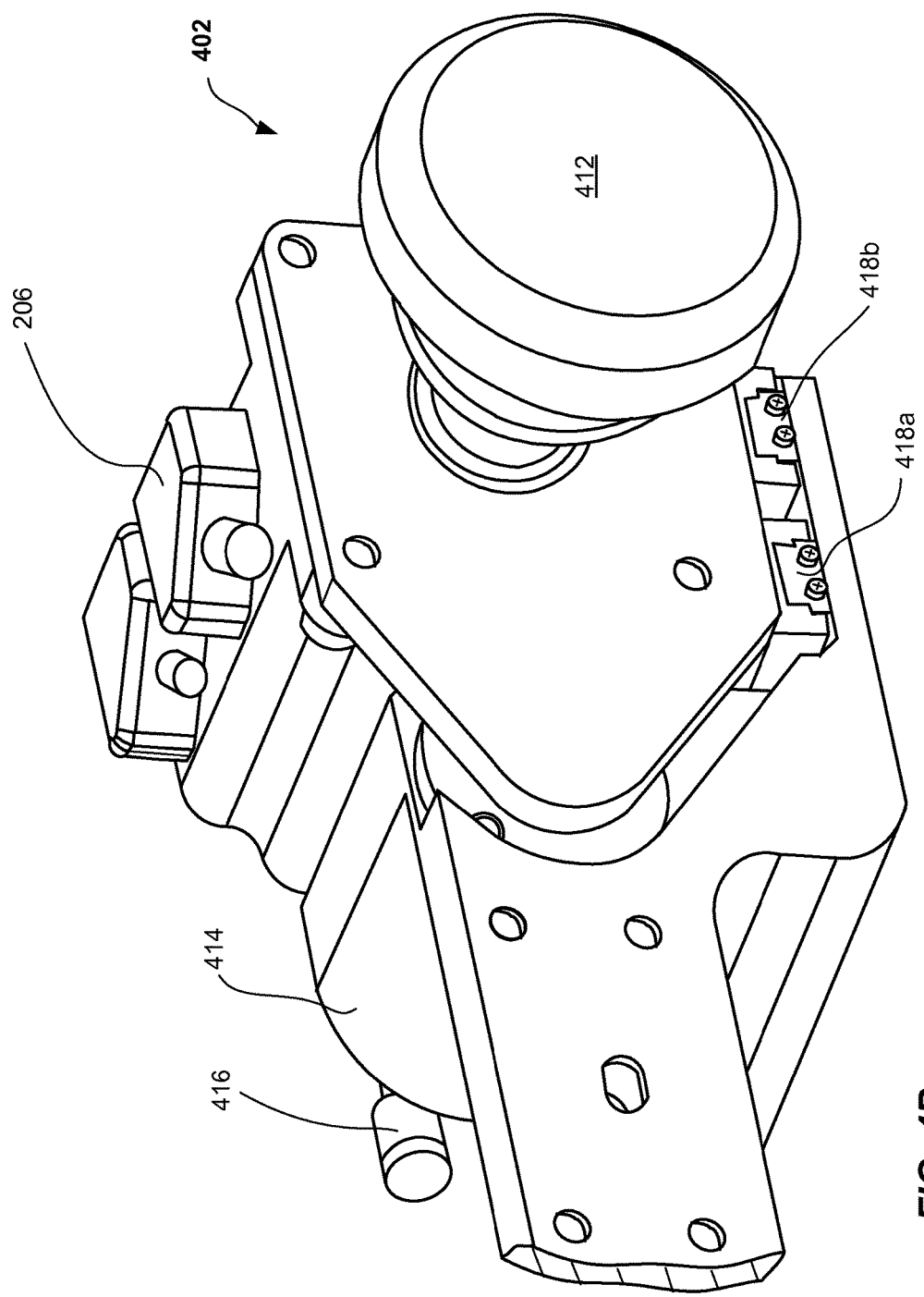
FIG. 4B is an isometric view of a bellows coupled to a motor and buff pad assembly provided in accordance with embodiments of the present invention.

FIG. 4B is an isometric view of the bellows 414 coupled to motor 206 and buff pad assembly 402. In the embodiment of FIG. 4B, slide bearings 418a-b are employed to couple the motor 206 to the swing arm 106, and to allow movement of the motor 206 and buff pad assembly 402 as the bellows 414 expands or contracts. Other configurations may be used.

Figure 5A:
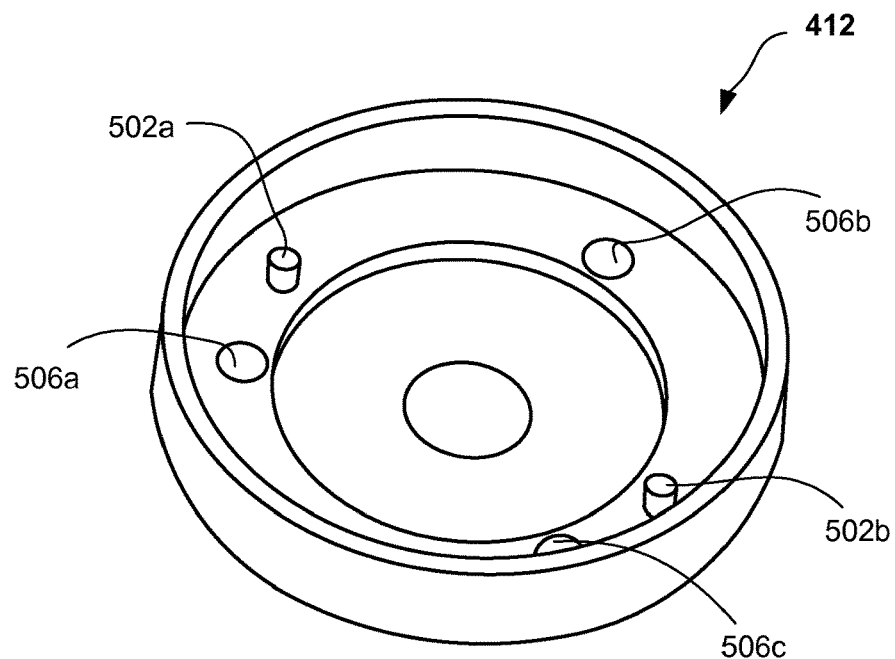
FIGS. 5A and 5B are an isometric bottom view of a buff head cap and flexure plate of FIG. 4A provided in accordance with embodiments of the present invention.
Figure 5B:
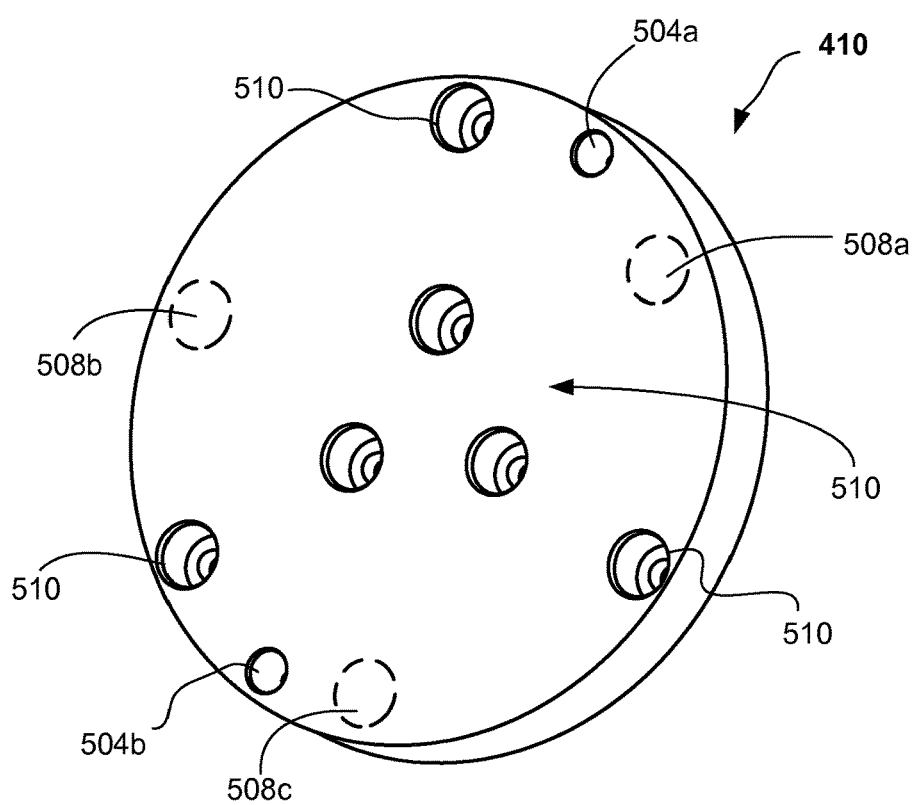

FIGS. 5A and 5B are an isometric bottom view of the buff head cap 412 and flexure plate 410 of FIG. 4A provided in accordance with embodiments of the present invention. As shown in FIGS. 5A-5B, in some embodiments, the buff head cap 412 includes two or more alignment features or pins 502a and 502b that correspond to holes 504a and 504b of flexure plate 410. One or more permanent magnets 506a-c embedded within buff head cap 412 align with permanent magnets 508a-c (shown in phantom) embedded within flexure plate 410. While two alignment pins and three permanent magnets are shown in FIGS. 5A and 5B, it will be understood that fewer or more alignment pins and/or magnets may be employed. For example, in some embodiments, twelve or more magnets may be embedded into each of flexure plate 410 and buff head cap 412. One or more attachment features 510 allow flexure plate 410 to attach to gimbal shroud 408 (FIG. 4A).

In operation, a buff pad 208 is coupled to buff head cap 412. For example, buff pad 208 may be attached to buff head cap 412 by double sided tape or another adhesive. Use of the alignment pins 502a-b and magnets 506a-c allows the buff head cap 412 to be quickly and securely attached to (or removed from) flexure plate 410. Likewise, replacement buff head caps 412 (with replacement buff pads attached thereto) may be quickly and easily installed. This may reduce system downtime during pad replacement. Buff head cap 412 may fit over flexure plate 410 as shown in FIG. 4A.

Figure 6:
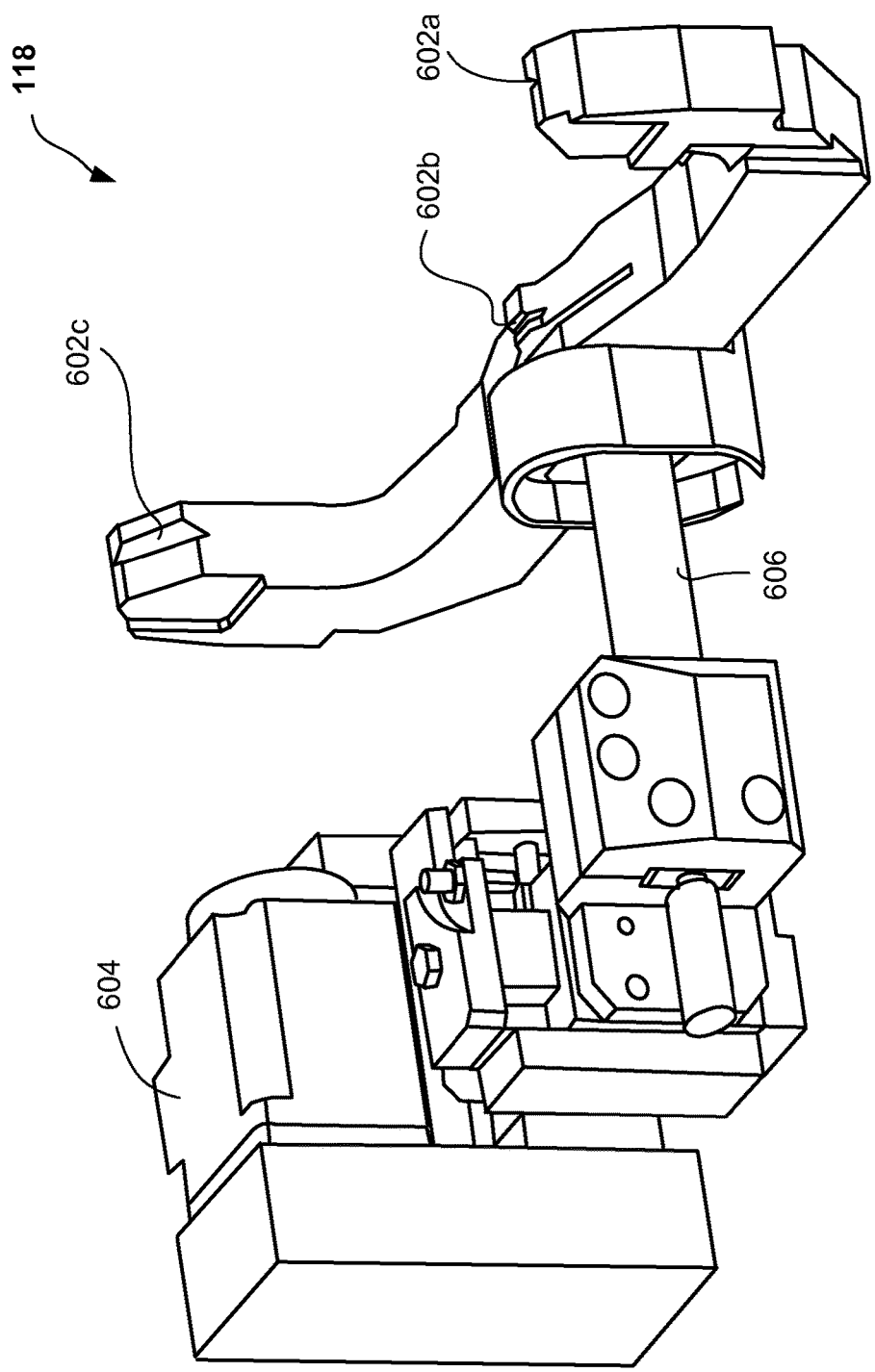
FIG. 6 is an isometric view of a substrate support of FIGS. 1A-C provided in accordance with embodiments of the present invention.

FIG. 6 is an isometric view of the substrate support 118 of FIGS. 1A-C provided in accordance with embodiments of the present invention. With reference to FIG. 6, the substrate support 118 includes support grooves 602a, 602b and 602c which support substrate 102 at three points of contact along an edge of the substrate 102. Fewer or more support grooves may be provided. As shown in FIG. 6, a motor 604 may be coupled to the substrate support 118 via a shaft 606 for moving the substrate support 118 away from or toward the substrate chuck 104 during substrate unload or load operations. The motor 604 may be controlled by the controller 210 (FIG. 2), for example.

Figure 7:
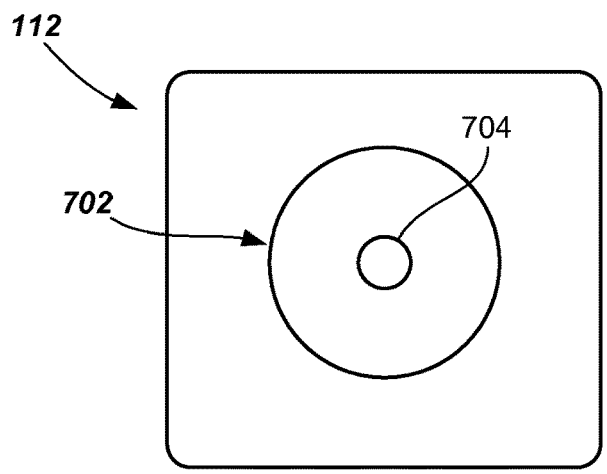
FIG. 7 is a front view of a pad conditioning station of FIGS. 1A-1C provided in accordance with embodiments of the present invention.

FIG. 7 is a front view of the pad conditioning station 112 of FIGS. 1A-1C provided in accordance with embodiments of the present invention. For example, in some embodiments, a nylon bristle or other suitable brush 702 may be used with or without chemistry (e.g., applied through a center 704 of the brush 702) for in-situ or ex-situ conditioning of the buff pad 208. Such conditioning may be performed to break in the buff pad 208, for cleaning and/or to roughen the surface of the buff pad 208, etc. In other embodiments, a diamond embedded or abrasive conditioning pad may be employed to condition and/or clean the buff pad 208. In one or more embodiments, the buff pad 208 may be conditioned prior to use, between substrate buff cleaning operations, between sweep cycles, while a substrate is being loaded into or removed from the pre-clean buff module 100, during idle and/or at any desired time or frequency.

To reduce substrate rotation and/or slippage relative to the substrate chuck 104, a carrier film 812 (FIG. 8) may be provided between the substrate chuck 104 and substrate 102. For example, the carrier film 812 may be a close cell polyurethane disk having openings that allow vacuum to be applied to the substrate 102 through the carrier film 812. In some embodiments the carrier film 812 may include carbon binders to improve the compression properties of the carrier film 812. Example thickness ranges for the carrier film 812 range from about 25-60 mils. Other carrier film materials, types, thicknesses and/or configurations may be employed.

Figure 8:
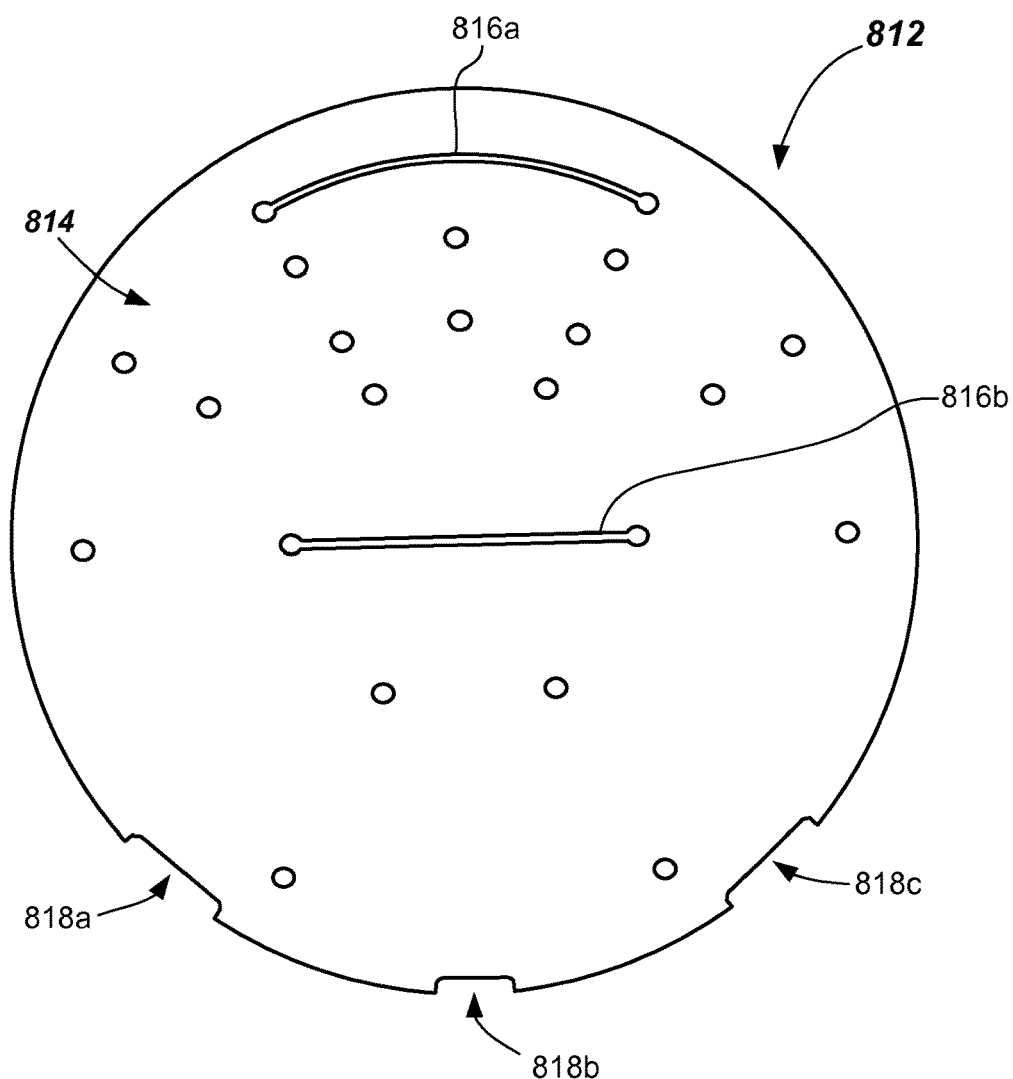
FIG. 8 is a schematic illustration of a carrier film for use with the substrate chuck of the pre-clean buff module of FIGS. 1A-C provided in accordance with embodiments of the present invention.

In the embodiment of FIG. 8, the carrier film 812 includes a plurality of small openings 814, as well as larger openings 816a-816b. Cut outs 818a-c may be provided for accommodating support of the substrate 102 via substrate support 118 (FIG. 6) and/or for use during substrate positioning/orientation. The cut outs 818a-c may align with notches 120a-c of substrate chuck 104 (FIG. 1C).

In the embodiment of FIG. 8, more openings are provided in the upper half of the carrier film 812. For example, during substrate de-chucking, the carrier film 812 may tend to "hold" the substrate 102. To free the substrate 102, the vacuum applied to the backside of the substrate 102 may be turned off, and a slightly pressurized gas may be applied to the backside of the substrate 102 through the openings in the carrier film 812. Additional pressure locations (e.g., provided by openings in carrier film 812) at the upper portion of the substrate 102 may help compensate for the pressure applied to the bottom of the substrate 102 by the substrate support 118 during de-chucking. Other de-chucking and/or carrier film 812 configurations may be employed.

Figure 9:
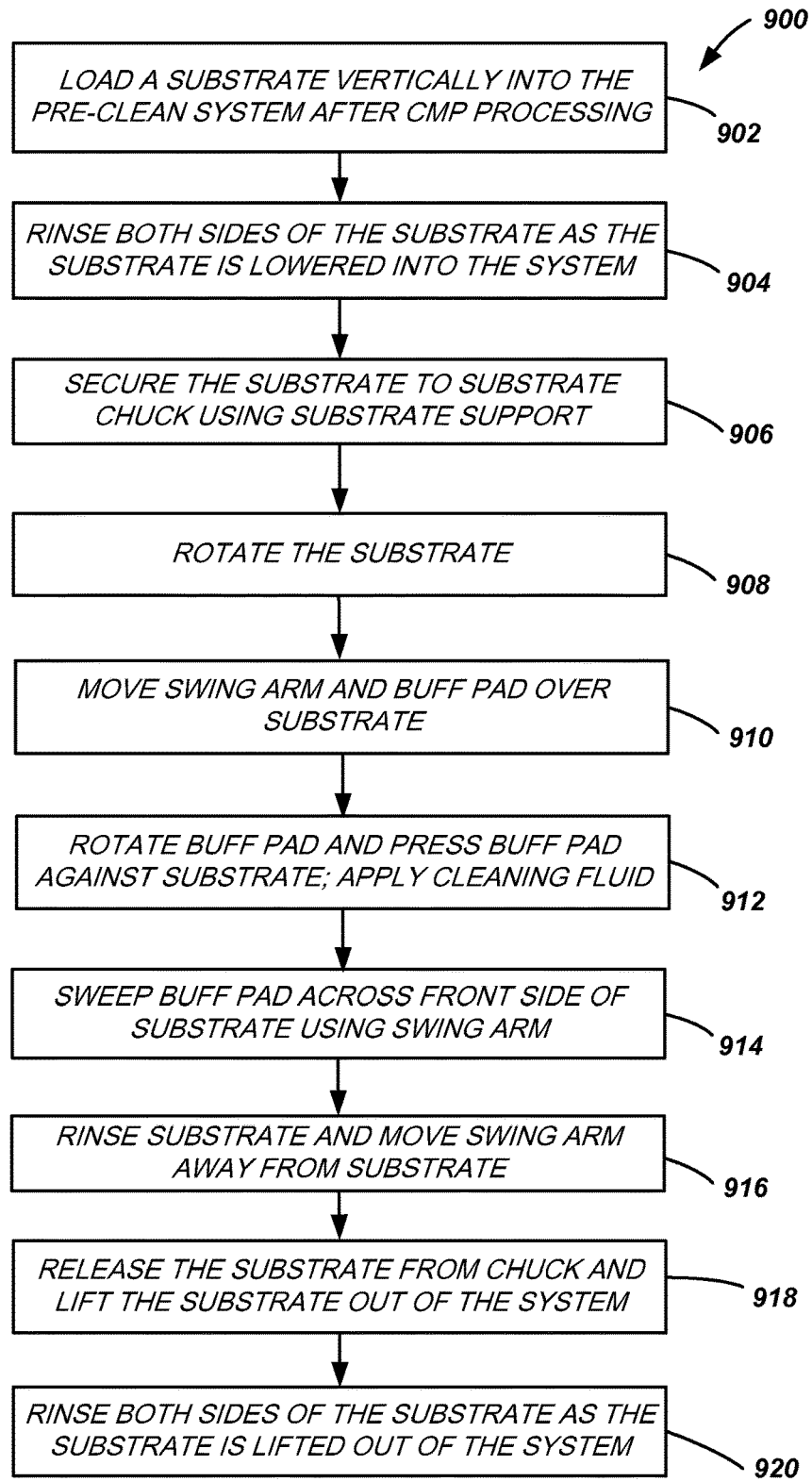
FIG. 9 is a flowchart of an example method of pre-clean buffing a substrate following CMP in accordance with embodiments of the present invention.

FIG. 9 is a flowchart of an example method 900 of pre-clean buffing a substrate following CMP in accordance with embodiments of the present invention. While operation of the of the system 100 is described primarily with regard to pre-cleaning a substrate after CMP, it will be understood that a similar method 900 may be used to buff clean a substrate after other substrate processing steps (e.g., etching so as to remove etch residue or for other applications), whether or not a subsequent cleaning step is performed.

With reference to FIG. 9, in Block 902 the substrate 102 is loaded into the pre-clean buff module 100. For example, a robot (not shown) may lower the substrate 102 into the tank 108 of the pre-clean buff module 100 and onto the substrate support 118. In some embodiments, in Block 904, the substrate 102 may be rinsed with DI water or another fluid while being lowered onto substrate support 118 using rinsing fluid delivery mechanisms 114a and 114b.

In Block 906 the substrate 102 is secured to substrate chuck 104. For example, the substrate support 118 may move the substrate 102 proximate the substrate chuck 104 (by aligning with notches 120a-c of the substrate chuck 104). A vacuum may be applied through substrate chuck 104 (and carrier film 812) to securely hold the substrate 102 against the substrate chuck 104. The substrate support 118 may then be lowered and/or moved out of the way.

In Block 908 the substrate 102 is rotated by rotating the substrate chuck 104 using motor 202 (FIG. 2). In Block 910, the swing arm 106 is moved to position the buff pad 208 over the substrate 102. In Block 912, the buff pad 208 is rotated (e.g., by motor 206) and pressed against the substrate 102 (e.g., by supplying a gas to bellows 414 of swing arm 106). In some embodiments, a cleaning chemistry or other fluid may be applied to the substrate 102 during pre-clean buffing (e.g., using the chemistry delivery mechanism 116a and/or 116b). Example chemistries include acid solutions, base solutions, $H_2O_2$, or the like.

In Block 914 the buff pad 208 is swept across the front side of substrate 102 using swing arm 106. For example, a predefined sweep or "cleaning" profile may be used to target cleaning as specific areas of substrate 102 (e.g., edge or other regions that may be hard to clean). In some embodiments, different loads on and/or rotation rates to the buff pad 208 may be employed. The buff/cleaning profile may be controllable by buff pad position and/or buff pad sweeping profile (e.g., including sweep range, frequency, shape, time for each sweeping zone, etc.). Various embodiments may target specific regions of the substrate 102, so that the pre-clean buff module 100 may be used to improve the edge defectivity of the substrate 102 (e.g., reduce defect levels near the edge of the substrate 102), which is difficult to achieve using conventional cleaning methods.

Following pre-clean buffing, in Block 916, the substrate 102 may be rinsed using the rinsing fluid delivery mechanisms 114a and/or 114b, and the swing arm 106 may be moved away from the substrate 102. For example, the swing arm 106 may move the buff pad 208 to the pad conditioning station 112 for cleaning/conditioning (FIG. 1C).

In Block 918 the substrate support 118 is positioned below the substrate 102 (e.g., using notches 120a-c of substrate chuck 104) and the substrate 102 is released to substrate support 118. For example, vacuum may be removed from the backside of the substrate 102, and a small gas pressure may be applied to free the substrate 102.

In Block 920 the substrate 102 is lifted from the tank 108 (e.g., using a suitable robot). During removal, in some embodiments, the substrate 102 may be rinsed with DI water or another fluid using the rinsing fluid delivery mechanisms 114a-b. The substrate 102 then may be transferred to a cleaning module such as a brush scrubber or megasonic tank for further cleaning.

As mentioned, in some embodiments, during substrate loading and/or unloading, the buff pad 208 may be cleaned and/or conditioned using the pad conditioning station 112.

Example process parameters for the pre-clean buff module 100 are provided below in Example 1. It will be understood that these process parameters are merely examples. Other process parameters and/or combinations of process parameters may be employed.

Example 1

In some embodiments, the pressure applied to the bellows 414 and/or buff pad 208 during polishing may range from about 0.1 to 4 psi. Example pressure accuracy may be about +/−4% full scale and example pressure response times range from less than about 0.5 to less than about 2 seconds. Other pressures, pressure accuracies and/or pressure response times may be employed.

In some embodiments, the buff pad 208 may be formed from polyurethane, silicone, polyvinyl alcohol or a similar material. Example buff pad diameters range from about 20-80 mm with a thickness of about 3.75 to about 6.25 mm. Example buff pad rotation rates range from about 0 to 3000 rotations per minute +/−0.4% full scale. Other buff pad materials, sizes and/or rotation rates may be employed.

In some embodiments, the swing arm 106 may allow for a sweep range of about 0 to 200 mm (on substrate), +/−0.4% full scale. Example sweep speeds for the swing arm 106 range from about 3 to 5 rad/sec (pivot), and in some embodiments about 4.14 rad/sec, +/−0.4% full scale. Other sweep ranges and/or sweep speeds may be employed.

In some embodiments, the substrate rotation rate may range from about 0 to 1500 RPM, +/−0.4 full scale. Other substrate rotation rates may be used.

In some embodiments, the carrier film 812 may be a continuous, non-embossed pad such as a close cell polyurethane disk. Other carrier film types and/or materials may be employed.

In some embodiments, example chemistries that may be employed during pre-clean buffing include an acid solution such as CX100 available from Wako Pure Chemical Industries, Ltd. of Osaka, Japan or Electroclean available from Air Products and Chemicals, Inc. of Allentown, Pa., a high pH chemistry, an alkalide solution, up to 30% concentration of $H_2O_2$, or the like. Other cleaning chemistries may be employed.

In some embodiments, a chemistry and/or rinsing fluid flow rate of about 150 to 3000 ml/min, +/−6% full scale may be used. Other chemistry and/or rinsing fluid flow rates may be employed.

In some embodiments, the pad conditioning station 112 may employ a fixed or rotating brush, such as a nylon brush, for conditioning and/or cleaning of the buff pad 208. Example conditioning brush sizes range from about 50-80 mm diameter. Other conditioning brushes and/or sizes may be employed. Note that an additional motor (not shown) may be used to rotate such a pad conditioning brush.

In some embodiments, the pre-clean buff module 100 may be compatible with chemistries having a pH range from about 1 to 12. Other pH compatibility ranges may be provided.

In some embodiments, a conditioning bristle brush can be used with chemistry applied through the center of the brush for in-situ or ex-situ conditioning of the buff pad 208. In other embodiments, a diamond dressing disk can be used for in-situ or ex-situ conditioning of the buff pad 208. In some embodiments, a surface hatch for changing the buff pad 208 (and/or for changing the conditioning bristle brush or diamond disk used for buff pad conditioning) can be included in the housing of the pre-clean buff module 100 (e.g., service hatch 110).

In some embodiments, the buff pad 208 may include a relatively soft buff pad (though which is harder than a typical PVA brush) to clean off difficult to remove particles. Embodiments of the present invention provide the ability to apply a chemical buff process to the front side of a substrate, for example, after conventional CMP is performed. Thus, embodiments of the present invention can be used to prepare the front side surface of a substrate after a CMP process for a cleaning process (e.g., using a conventional brush box or megasonic cleaner).

While cleaning chemistry is applied to the substrate 102, the swing arm 106 is adapted to sweep or oscillate the rotating buff pad 208 across the front side surface of the substrate to affect the pre-cleaning of the substrate 102. The swing arm 106 is oscillated by the motor 204 (e.g., via a gear drive assembly). In some embodiments, instead of a swing arm, a linear gantry can be used to support and move the buff pad 208, the buff pad motor 206, and optionally, the chemical delivery mechanism 116a.

Embodiments of the present invention provide a pre-clean apparatus and process that "pre-clean" a substrate after CMP, but prior to (and/or in place of) traditional substrate cleaning. In some embodiments, a pre-clean buff module may be substituted for a more traditional cleaning module of a cleaning tool (e.g., a brush box module).

Embodiments of the present invention provide a compact arrangement to pre-clean substrates post-CMP by using a chuck (e.g., a vacuum chuck) to support a substrate so that the front side is accessible for direct buffing using a relatively small buff pad (e.g., a polishing pad having a contact area with a diameter smaller than the diameter of the substrate) applied to a specific area of the front side of the substrate. Direct front side metrology can be used concurrently without the need to image through a window, polishing pad or the like. Chemistry may be dispensed directly on the front side of the substrate, easing dispense distribution as well as chemical consumption. In some embodiments, chemistry may be delivered directly to the substrate by an embedded spray dispense mounted on the swing arm (e.g., reducing chemistry consumption by improving and/or optimizing its control). In one or more embodiments, chemistry may be delivered directly through the buff pad.

In some embodiments, the pre-clean buff module 100 may be placed between a polisher and a brush box (for example, in place of a megasonic tank module). In some embodiments, the pre-clean buff module 100 may replace a brush box module. In one or more embodiments, the pre-clean buff module 100 may be used in addition to megasonics and brush scrubbing. For example, the pre-clean buff module 100 may be used with a megasonic tank and one or more brush boxes. In one example, the pre-clean buff module 100 may be used with a megasonic tank, two brush boxes and a substrate drying tool such as a spin rinse dryer or Marangoni dryer (e.g., four cleaning processes and one drying process).

In the embodiments shown, the substrate chuck 104 is a vertically oriented vacuum chuck configured to hold a substrate in place during buff cleaning in a vertical orientation. In other embodiments, the substrate 102 may be horizontally oriented and/or held without vacuum (e.g., clamped).

The buff pad 208 may be any suitable material such as porous polyurethane, silicone or the like suitable for removing particles, organic reside, etc. Example pressure that may be applied as the buff pad 208 is pressed against the substrate 102 by the swing arm 106 during buff cleaning may be about 1-2 psi for dielectrics and/or about 0.2-0.8 psi for soft metals. Larger or smaller pressures may be employed during buff cleaning.

Because the buff pad 208 is smaller than the substrate 102, the amount of buff cleaning may be varied or "tuned" across the substrate 102. For example, scan/sweep profile, sweep range, dwell time, sweep rate, buff pad pressure, buff pad rotation rate, substrate rotation rate, etc., may be adjusted and/or varied during buff cleaning. For example, sweep rate, dwell time, pressure, rotation rate and/or the like may be adjusted to improve edge cleaning.

As stated, in some embodiments, rinsing fluid and/or chemistries may be provided through the buff pad 208 and/or by a separate liquid delivery mechanism such as a fluid delivery line/spray nozzle coupled to swing arm 106. For example, buff pad 208 may include an opening (not shown) for delivery of rinsing fluid and/or any other desired chemistry to the substrate 102 during buff cleaning. In such embodiments, different rinsing and/or cleaning fluids may be used to clean and/or rinse the substrate 102 and the buff pad 208.

It will be readily apparent that the various methods described herein may be implemented by or under the control of, e.g., an appropriately programmed general purpose computer or other computing device. Typically a processor (e.g., one or more microprocessors) will receive instructions from a memory or like device, and execute those instructions, thereby performing one or more processes defined by those instructions. Further, programs that implement such methods may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software. Accordingly, a description of a process likewise describes at least one apparatus for performing the process, and likewise describes at least one computer-readable medium and/or memory for performing the process. The apparatus that performs the process can include components and devices (e.g., a processor, input and output devices) appropriate to perform the process. A computer-readable medium can store program elements appropriate to perform the method.

The foregoing description discloses only example embodiments of the invention. Modifications of the above-disclosed systems, apparatus, and methods which fall within the scope of the invention will be readily apparent to those of ordinary skill in the art. For example, in some embodiments, a dilute slurry may be used with the pre-clean buff module 100 to improve particle and/or residue removal (e.g., for undercut). While embodiments of the invention have been described primarily with regard to pre-cleaning a substrate after CMP and before megasonics or brush scrubbing, it will be understood that embodiments of the invention may be employed for other cleaning and/or pre-cleaning applications. For example, the pre-clean buff module 100 may be employed to remove post-etch residue from a substrate, for back side cleaning of a substrate, to remove chuck marks from the back side of a substrate or the like. In some embodiments, an additional cleaning step may not be employed following buff cleaning (e.g., such as when the substrate is to undergo further processing). That is, the pre-clean buff module 100 may be used more generally as a buff cleaning module for any suitable application.

Accordingly, while the invention has been disclosed in connection with example embodiments thereof, it should be understood that other embodiments may fall within the scope of the invention, as defined by the following claims.

The invention claimed is:

1. An apparatus for cleaning a substrate comprising:
    a substrate chuck configured to support a substrate with a front side of the substrate accessible;
    a buff pad assembly including a flexure plate having a first side and an opposite second side, and a buff head cap, the buff head cap supporting a buff pad having a diameter smaller than a diameter of the substrate; and
    a swing arm having a rotatable shaft coupled to the buff pad assembly and configured to position and rotate the buff pad by way of the flexure plate along the front side of the substrate, and control an amount of force applied by the buff pad against the front side of the substrate during cleaning,
    wherein the first side of the flexure plate is coupled to the rotatable shaft of the swing arm via a gimbal and the second side of the flexure plate is removably coupled to the buff head cap; and
    wherein the substrate chuck, buff pad assembly and swing arm are configured to buff clean the substrate.

2. The apparatus of claim 1 wherein the substrate chuck is configured to hold the substrate in a vertical orientation during cleaning with a buff pad.

3. The apparatus of claim 1 wherein the swing arm includes a motor configured to rotate the buff pad assembly and wherein the first side of the flexure plate is coupled to the motor of the swing arm via the gimbal.

4. The apparatus of claim 1 wherein the second side of the flexure plate and buff head cap include one or more magnets configured to hold the flexure plate and buff head cap together.

5. The apparatus of claim 4 wherein the flexure plate and buff head cap include one or more alignment features that align one or more magnets of the flexure plate with one or more magnets of the buff head cap when the flexure plate and buff head cap are coupled together.

6. The apparatus of claim 1 wherein the swing arm includes a motor that drives rotation of the buff pad assembly and a bellows coupled to the motor, wherein inflation of the bellows causes movement of the buff pad assembly and a change in force with which a buff pad is pressed against the substrate during cleaning with the buff pad.

7. The apparatus of claim 1 further comprising a fluid delivery mechanism coupled to the swing arm and configured to deliver a fluid to an interface between a buff pad and the substrate during cleaning with the buff pad.

8. The apparatus of claim 7 wherein the fluid delivery mechanism coupled to the swing arm is configured to deliver chemicals to the interface between a buff pad and a substrate.

9. The apparatus of claim 1 further comprising at least one of first and second rinsing fluid delivery mechanisms configured to deliver rinsing fluid to at least one of a front side and a back side of a substrate.

10. The apparatus of claim 1 further comprising a substrate support configured to support a substrate and position the substrate proximate the substrate chuck during loading, and to support the substrate during unloading.

11. The apparatus of claim 1 further comprising a pad conditioning station including a brush or abrasive conditioning pad configured to at least one of clean and condition a buff pad.

12. A pre-clean buff module for cleaning a substrate following chemical mechanical planarization comprising:

a tank;

a substrate chuck positioned within the tank and configured to support a substrate with a front side of the substrate accessible;

a buff pad assembly including a flexure plate having a first side and an opposite second side, and a buff head cap, the buff head cap positioned within the tank and supporting a buff pad having a diameter smaller than a diameter of the substrate;

a swing arm positioned within the tank and having a rotatable shaft coupled to the buff pad assembly by way of the flexure plate, the swing arm configured to position and rotate the buff pad along the front side of the substrate and control an amount of force applied by the buff pad against the front side of the substrate; and a pad conditioning station including a brush or abrasive conditioning pad positioned within the tank and configured to at least one of clean and condition the buff pad, the pad conditioning station positioned so that the swing arm is rotatable to place the buff pad proximate the pad conditioning station;

wherein the first side of the flexure plate is coupled to the rotatable shaft of the swing arm via a gimbal and the second side of the flexure plate is removably coupled to the buff head cap; and wherein the substrate chuck, buff pad assembly and swing arm are configured to buff clean the substrate after a chemical mechanical planarization process.

13. The pre-clean buff module of claim 12 further comprising a fluid delivery mechanism coupled to the swing arm and configured to deliver a fluid to an interface between the buff pad and the substrate during pre-cleaning with the buff pad.

* * * * *